(12) United States Patent
Wong et al.

(10) Patent No.: US 6,952,572 B2
(45) Date of Patent: Oct. 4, 2005

(54) IMAGE REJECTION MIXER WITH SWITCHABLE HIGH OR LOW SIDE INJECTION

(75) Inventors: Ka Hung Derek Wong, Singapore (SG); Ten Voon Wong, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 947 days.

(21) Appl. No.: 09/885,487

(22) Filed: Jun. 20, 2001

(65) Prior Publication Data

US 2002/0197972 A1 Dec. 26, 2002

(51) Int. Cl.$^7$ .................................................. H04B 1/26
(52) U.S. Cl. .................... 455/318; 455/319; 455/324
(58) Field of Search ............................... 455/318, 319, 455/324

(56) References Cited

U.S. PATENT DOCUMENTS

| | | | |
|---|---|---|---|
| 4,696,017 A | * 9/1987 | Masheff et al. | ............. 375/296 |
| 5,029,237 A | 7/1991 | Ragan | |
| 5,031,233 A | 7/1991 | Ragan | |
| 5,140,198 A | 8/1992 | Atherly et al. | |
| 5,230,094 A | 7/1993 | Kitching et al. | |
| 5,271,041 A | * 12/1993 | Montreuil | ............. 375/344 |
| 5,392,011 A | 2/1995 | Li | |
| 5,633,898 A | * 5/1997 | Kishigami et al. | ............. 375/344 |
| 5,861,781 A | * 1/1999 | Ashby | ............. 332/170 |
| 5,943,370 A | * 8/1999 | Smith | ............. 375/334 |
| 6,009,130 A | 12/1999 | Lurey et al. | |
| 6,097,269 A | 8/2000 | Hernandez | |
| 6,532,270 B1 | * 3/2003 | Bell et al. | ............. 375/301 |

OTHER PUBLICATIONS

Galal et al., "RC sequence asymmetric polyphase networks for RF integrated tranceivers," IEEE transactions on circuits and systems—Iianalog and digital signal processing, vol. 47, No. 1, Jan. 2000, pp. 18–27.

Rudell et al., "A 1.9 GHz wide–band IF double conversion CMOS receiver for cordless telephone applications," IEEE journal of solid–state circuits, vol. 32, No. 12, Dec. 1997, pp. 2071–2088.

Rudell et al., "Recent developments in high integration multi–standard CMOS tranceivers for personal communication systems," Department of electrical engineering and computer sciences, University of California at berkeley.

Rudell et al., "A self–adapting RF CMOS image–rejection mixer," Solid–state circuits, vol. 32, No. 12, Dec. 1997.

* cited by examiner

Primary Examiner—Ahmad F. Matar
Assistant Examiner—Hector A. Agdeppa

(57) ABSTRACT

An image rejection mixer includes first and second mixers, a phase shift circuit and a summer. The first mixer receives an RF input signal and a first local oscillator (LO) signal and generates a first intermediate frequency (IF) output signal. The second mixer receives the RF input signal and a second LO signal and generates a second IF output signal. The first LO signal is a phase lag signal (sin $\omega_{lo}t$) and the second LO signal is a phase lead signal ($-\cos \omega_{lo}t$), where $\omega_{lo}t$ is a frequency signal generated by a local oscillator. The phase shift circuit is connected between the summer and the first mixer, receives the first IF output signal and generates a phase lag signal. The phase shift circuit causes the phase lag signal to lag the first IF output signal by about 90 degrees. The summer is connected to the phase shift circuit and the second mixer, receives the second IF output signal and the phase lag signal, and generates a combined IF output signal. The image rejection mixer is switchable between high and low side injection simply by inverting the second LO signal.

17 Claims, 3 Drawing Sheets

-PRIOR ART-

IMAGE REJECTION MIXER WITH SWITCHABLE HIGH OR LOW SIDE INJECTION

BACKGROUND OF THE INVENTION

1. Field of the Invention

The present invention relates to telecommunications and radio frequency receivers, and more particularly to an image rejection mixer with switchable high or low side injection for a radio frequency to intermediate frequency converter.

2. Description of Related Art

The field of telecommunications has been developing rapidly. Hand-held mobile communications devices are now ubiquitous. With the popularity of such devices has come the demand for smaller size, higher speed, lower power consumption and lower cost. To accomplish these demands requires greater integration of the electronic components.

Most RF communications devices today use some variant of the conventional super-heterodyne approach. In conventional heterodyne receivers the received radio frequency (RF) is normally converted to one or more lower intermediate frequencies (IF) because the intermediate frequencies are more readily amplified and filtered. The RF signal is converted to an IF signal by injecting a mixing signal generated by a local oscillator into the RF signal. Unfortunately, the image of the RF signal can be mixed to the same IF frequency, which corrupts the desired output signal.

FIG. 1 is a graph showing low-side local oscillator (LO) injection, in which a carrier frequency (RF) is higher than a LO injection frequency and an image signal is lower than the LO frequency, while FIG. 2 is a graph showing high-side LO injection, in which the carrier frequency (RF) is lower than the LO injection frequency and an image signal is higher than the LO frequency. Filtering is necessary to attenuate such unwanted signals. If the unwanted signals are not attenuated sufficiently, they may be converted to a base band frequency that interferes with the desired output signal.

One method of attenuating such unwanted signals is via filtering. U.S. Pat. No. 6,097,269 assigned to Motorola, Inc., the assignee of the present application, discloses a single, tunable filter capable of both high and low side injection protection. The filter includes a pair of reactively coupled resonators, which are formed with varactors, capacitors and inductors.

FIG. 3 is a schematic block diagram of a conventional image rejection mixer 20 that provides one of either high-side injection or low-side injection. The image rejection mixer 20 includes a first mixer 22 that receives an RF input signal and a first local oscillator (LO) signal and generates a first intermediate frequency (IF) output signal. A second mixer 24 receives the RF input signal and a second LO signal and generates a second IF output signal. The first LO signal is a phase lag signal or sin $\omega_{lo}t$ and the second LO signal is a phase lead signal or cos $\omega_{lo}t$, wherein $\omega_{lo}t$ is a frequency signal generated by a local oscillator (not shown). A phase shift circuit 26 is connected to the first mixer 22, receives the first IF output signal, and produces a phase shifted signal. The phase shifted signal and the second IF output signal are combined with a summer 28, thereby providing a final IF output signal.

If the phase shift circuit 26 generates a 90 degrees phase lead signal, the image rejection mixer 20 provides high-side injection. On the other hand, if the phase shift circuit 26 generates a 90 degrees phase lag signal, the image rejection mixer 20 provides low-side injection.

It would be advantageous if a low power image rejection mixer could be formed on a single substrate, without discrete components, that is switchable between high-side injection and low-side injection.

SUMMARY OF THE INVENTION

The present invention provides an image rejection mixer that is switchable for either high side injection or low side injection.

In a first embodiment, the present invention provides an image rejection mixer including a first mixer that receives an RF input signal and a first local oscillator (LO) signal and generates a first intermediate frequency (IF) output signal and a second mixer that receives the RF input signal and a second LO signal and generates a second IF output signal. The first LO signal is sin $\omega_{lo}t$ and the second LO signal is −cos $\omega_{lo}t$, where $\omega_{lo}t$ is a frequency signal generated by a local oscillator. A summer is connected to the first and second mixers for receiving the first and second IF output signals and generating a combined IF output signal.

In a second embodiment, the present invention provides a quadrature limiter circuit including an I limiter circuit having an I limiter first side and an I limiter second side, where the I limiter first side is a phase inverting side and the I limiter second side is a phase non-inverting side. The I limiter circuit receives a first local oscillator (LO) signal and generates a pair of I limiter output signals. An injection enable signal is provided to the I limiter first and second sides for selectively enabling one of the I limiter first and second sides. A Q limiter circuit includes a Q limiter first side and a Q limiter second side. The Q limiter circuit receives a second local oscillator (LO) signal and generates a pair of Q limiter output signals. The Q limiter first side is always enabled and the Q limiter second side is always disabled.

In a third embodiment, the present invention provides a method of generating an intermediate frequency (IF) signal from a radio frequency (RF) signal, including the steps of mixing an RF input signal and a first local oscillator (LO) signal to generate a first intermediate frequency (IF) output signal, where the first LO signal is sin $\omega_{lo}t$ mixing the RF input signal and a second LO signal to generate a second IF output signal, where the second LO signal is −cos $\omega_{lo}t$, $\omega_{lo}t$ is a frequency signal generated by a local oscillator, and summing the first and second IF output signals to generate a combined IF output signal.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1:
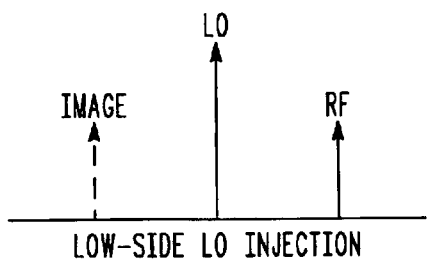
FIGS. 1 and 2 are graphs showing the relationship between an RF signal, a local oscillator signal and an image signal.

In the drawings, like numerals are used to indicate like elements throughout.

Figure 4:
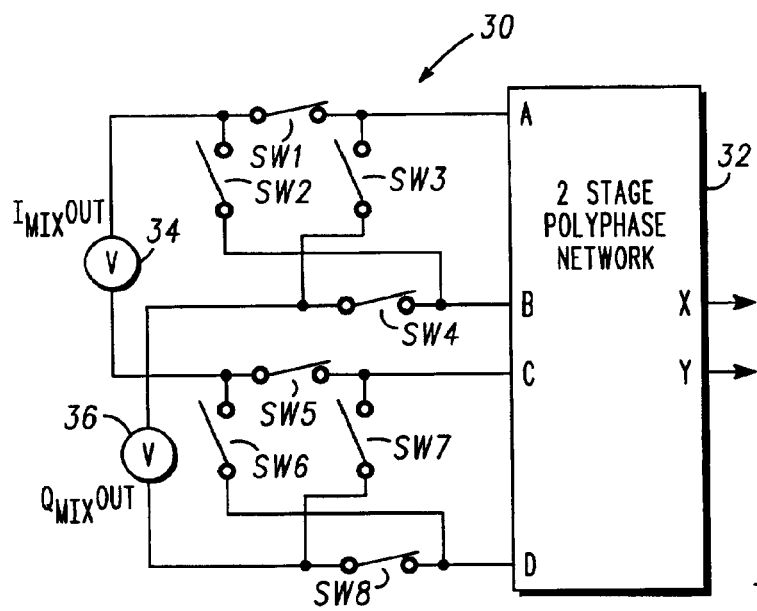
FIG. 4 is schematic diagram of an image rejection mixer that uses a network of switches for producing a phase shift.

Referring to FIG. 4, an image rejection mixer circuit 30 that is switchable for either high-side injection or low-side injection in accordance with a first embodiment of the present invention is shown. The image rejection mixer circuit 30 includes a two-stage polyphase network 32 and a plurality of switches SW1–SW8. The switches SW1–SW8 are connected between first and second mixers 34, 36 and the polyphase network 32. As will be understood by those of skill in the art, the first mixer 34 is an I mixer and the second mixer is a Q mixer, "I" being the "in-phase" component of the waveform and "Q" the quadrature component. The polyphase network 32 produces a quadrature phase lead and phase lag differential signal. The switches SW1–SW8 are used to steer the differential IF signals output from the first and second mixers 34, 36 to the appropriate input terminals A–D of the polyphase network 32. Polyphase networks are passive R and C networks, providing an efficient way for wideband quadrature signal generation with reduced sensitivity to component mismatch. Such two stage polyphase networks that can produce phase lead and phase lag are known to those of skill in the art.

For example, as shown in FIG. 4, to produce a 90 degree phase lead, the noninverting output of the I mixer 34 is provided to the A input of the polyphase network 32 by closing SW1 and opening SW2. The inverting output of the I mixer 34 is provided to the C input of the polyphase network 32 by closing SW5 and opening SW6. At the same time, the noninverting output of the Q mixer 36 is provided to the B input by closing SW4 and opening SW3, and the inverting output of the Q mixer 36 is provided to the D input by closing SW8 and opening SW7. In this manner, the X and Y outputs of the polyphase network 32 provide a differential signal in which the I path leads the Q path by 90 degrees.

On the other hand, to produce a 90 degree phase lag, SW1 is opened and SW2 is closed to steer the noninverting output of the I mixer 34 to the B input of the polyphase network 32 and SW3 is closed and SW4 is opened to steer the noninverting output of the Q mixer 36 to the A input of the polyphase network 32. At the same time, SW5 is opened and SW6 is closed to steer the inverting output of the I mixer 34 to the D input terminal, and similarly, SW7 is closed and SW8 is opened to steer the inverted output signal of the Q mixer 36 to the C input terminal. In contrast to above, the X and Y outputs of the polyphase network 32 now provide a differential signal in which the I path lags the Q path by 90 degrees.

The switches SW1–SW8 are preferably implemented with MOS transmission gates. Thus, the image rejection mixer 20 can be modified to selectively either high or low side injection by adding the switches SW1–SW8. The mixer circuit 30 is suitable when the IF frequency is low and the required space on a chip substrate is available because at low frequency, the resistance Rs in the passive polyphase network 32 is relatively large in comparison to the on-resistance (about 25 ohms) of the transmission gates (SW1–SW8). To implement 25 ohm on-resistance using presently available technology requires approximately one 100 um×0.4 um PMOS gate and one 50 um×0.4 NMOS gate for each switch, and the mixer 30 uses eight switches (SW1–SW8). Furthermore, at high frequency, the resistance Rs in the polyphase network 32 decreases such that larger MOS switches are required. Further, signal loss is experienced due to parasitic capacitance.

It has been determined that instead of steering the IF signals to the appropriate terminals of the two-stage polyphase network 32 to select between phase lead and phase lag in order to perform high or low-side injection, high or low-side injection can be selected by inverting the LO phase before providing it to the I mixer 34, and thus, only a phase lag is required of the Q mixer 36 IF output signal.

Figure 5:
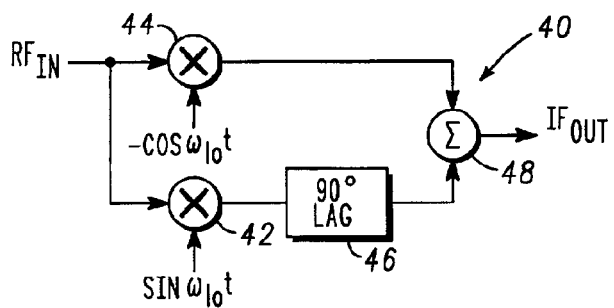
FIGS. 5 and 6 are schematic block diagrams of image rejection mixers that perform one of high side injection and low side injection in accordance with the present invention.

FIG. 5 is a schematic block diagram of an image rejection mixer 40 according to the present invention. The image rejection mixer 40 includes a first mixer 42 that receives an RF input signal RFin and a first local oscillator (LO) signal (sin $\omega_{lo}t$) and generates a first intermediate frequency (IF) output signal. A second mixer 44 receives the RF input signal RFin and a second LO signal ($-\cos \omega_{lo}t$) from the local oscillator and generates a second IF output signal. Local oscillators and associated circuitry capable of generating the first and second LO signals are understood by those of skill in the art and thus, a detailed description of the local oscillator is not required to understand the invention.

A phase shift circuit 46 is connected to the first mixer 42, receives the first IF output signal, and generates a phase lag signal. The phase shift circuit 46 causes the phase lag signal to lag the first IF output signal preferably by about 90 degrees. A summer 48 is connected to the phase shift circuit 46 and the second mixer 44 and receives the phase lag signal and the second IF output signal. The summer 48 combines the phase lag signal and the second IF output signal to generate a combined IF output signal IFout.

Figure 2:
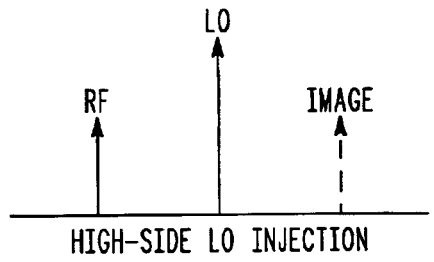

The image rejection mixer 40, as shown in FIG. 5, produces a high-side LO injection, which corresponds to the graph shown in FIG. 2.

Figure 3:
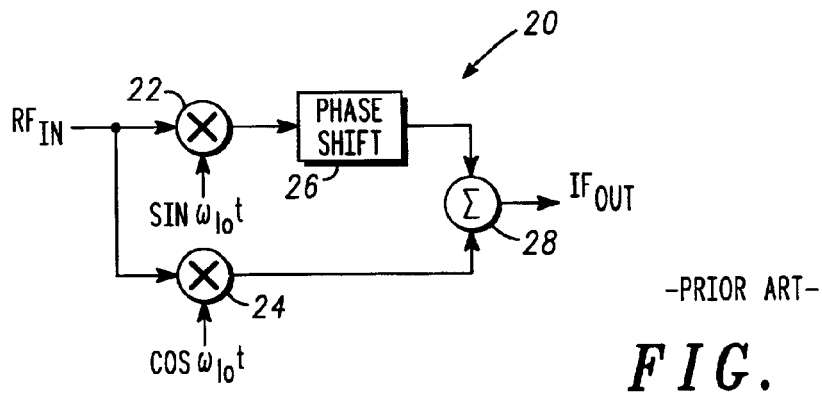
FIG. 3 is a schematic block diagram of a conventional image rejection mixer that provides one of high-side injection or low-side injection.
Figure 6:
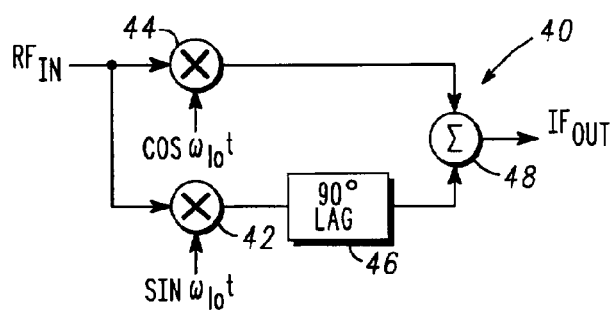

FIG. 6 is also a schematic block diagram of the image rejection mixer 40 according to the present invention, except that the LO input to the second mixer 44, i.e., the second LO signal, is cos $\omega_{lo}t$. When the second LO signal is cos $\omega_{lo}t$, the mixer 40 performs low-side LO injection, which corresponds to the graph shown in FIG. 2. Thus, in order to perform high or low-side injection, rather than steering the mixer output signals to a phase shift circuit for performing a phase lead or a phase lag, as required by the prior art circuit 20 (FIG. 3), the present invention requires only selectively inverting the input to the second mixer circuit 44.

Figure 7:
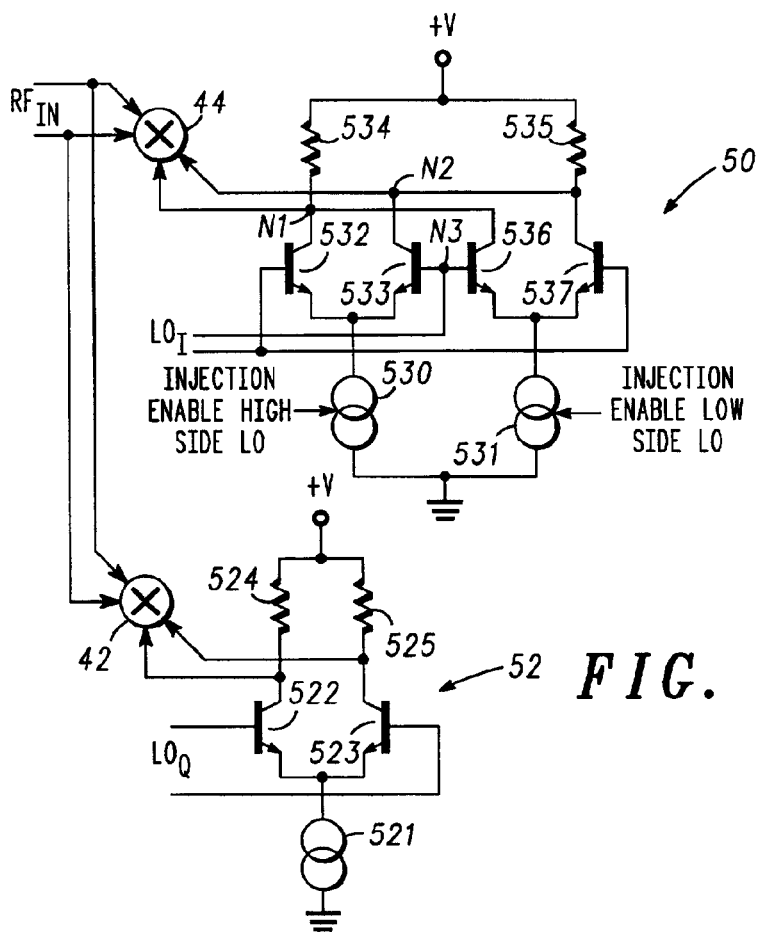
FIG. 7 is schematic circuit diagram of a first quadrature limiter circuit of an image rejection mixer that selectively performs high side and low side injection in accordance with the present invention.

FIG. 7 shows a first embodiment of an I limiter circuit 50 for inverting the second LO signal provided to the second mixer circuit 44 and a Q limiter circuit 52 for providing the first LO signal to the first mixer circuit 42. Preferably, the first and second mixer circuits 42, 44 are differential circuits. Thus, FIG. 7 shows the first and second mixer circuits 42, 44 receiving pairs of the RF input signal RFin and a pair of the respective one of the first and second LO signals.

The Q limiter circuit 52 is connected to the first mixer circuit 42. The Q limiter circuit 52 receives an $LO_Q$ signal from a local oscillator (not shown) and generates the first LO signal therefrom. In the first embodiment, the Q limiter 52 comprises a first current source 521, a first transistor 522, a second transistor 523, a first resistor 524 and a second resistor 525. A first terminal of the first current source 521 is connected to ground. The emitters of the first and second transistors 522, 523 are connected together and to a second terminal of the first current source 521. The first current source 521 is always enabled. The bases of the first and second transistors 522, 523 receive the differential $LO_Q$ signal from the local oscillator. The collectors of the first and second transistors 522, 523 are connected together by way of the first and second resistors 524, 525. The first LO signal is a differential signal obtained at the collectors of the first and second transistors 522, 523.

The I limiter circuit 50 is connected to the second mixer circuit 44. The I limiter circuit 50 receives an LO, signal from the local oscillator and generates the second LO signal. The I limiter circuit 50 preferably comprises a second current source 530, a third current source 531, a third transistor 532, a fourth transistor 533, a third resistor 534, a fourth resistor 535, a fifth transistor 536 and a sixth transistor 537.

A first terminal of the second current source 530 is connected to ground. The emitters of the third and fourth transistors 532, 533 are connected to each other and to a second terminal of the second current source 530. The bases of the third and fourth transistors 532, 533 receive the $LO_I$ signal. The third current source 531 has a first terminal connected to ground. The emitters of the fifth and sixth transistors 536, 537 are connected together and to a second terminal of the third current source 531. The bases of the fifth and sixth transistors 536, 537 receive the $LO_I$ signal. The collectors of the third and fifth transistors 532, 536 are connected together at a first node N1, the collectors of the fourth and sixth transistors 533, 537 are connected together at a second node N2, and the bases of the fourth and fifth transistors 533, 536 are connected to each other at a third node N3. The third resistor 534 has a first terminal connected to the first node N1. The fourth resistor 535 has a first terminal connected to the second node N2 and a second terminal connected to the second terminal of the third resistor 534. The second LO signal is a differential signal obtained at the first and second nodes N1, N2.

The I limiter circuit 50 receives an injection enable signal for selecting between high-side LO injection and low-side LO injection. That is, for high-side LO injection, the second current source 530 is enabled by the injection enable signal and for low-side LO injection, the third current source 531 is enabled by the injection enable signal (i.e., the inverse of the injection enable signal). Further, as should be understood by those of skill in the art, it is important that I limiter circuit 50 differential output signals and the Q limiter circuit 52 differential output signals are fed to the same respective inputs of the first and second mixers 42, 44.

It has been determined that at high frequency, the I limiter circuit 50 and the Q limiter circuit 52 do not produce a good image rejection ratio (IRR) because the paths presented from the I LO and the Q LO differ such that a phase mismatch that is not 90 degrees is produced. For examples, at frequencies in the 2.4 GHz range, the IRR degrades significantly.

Figure 8:
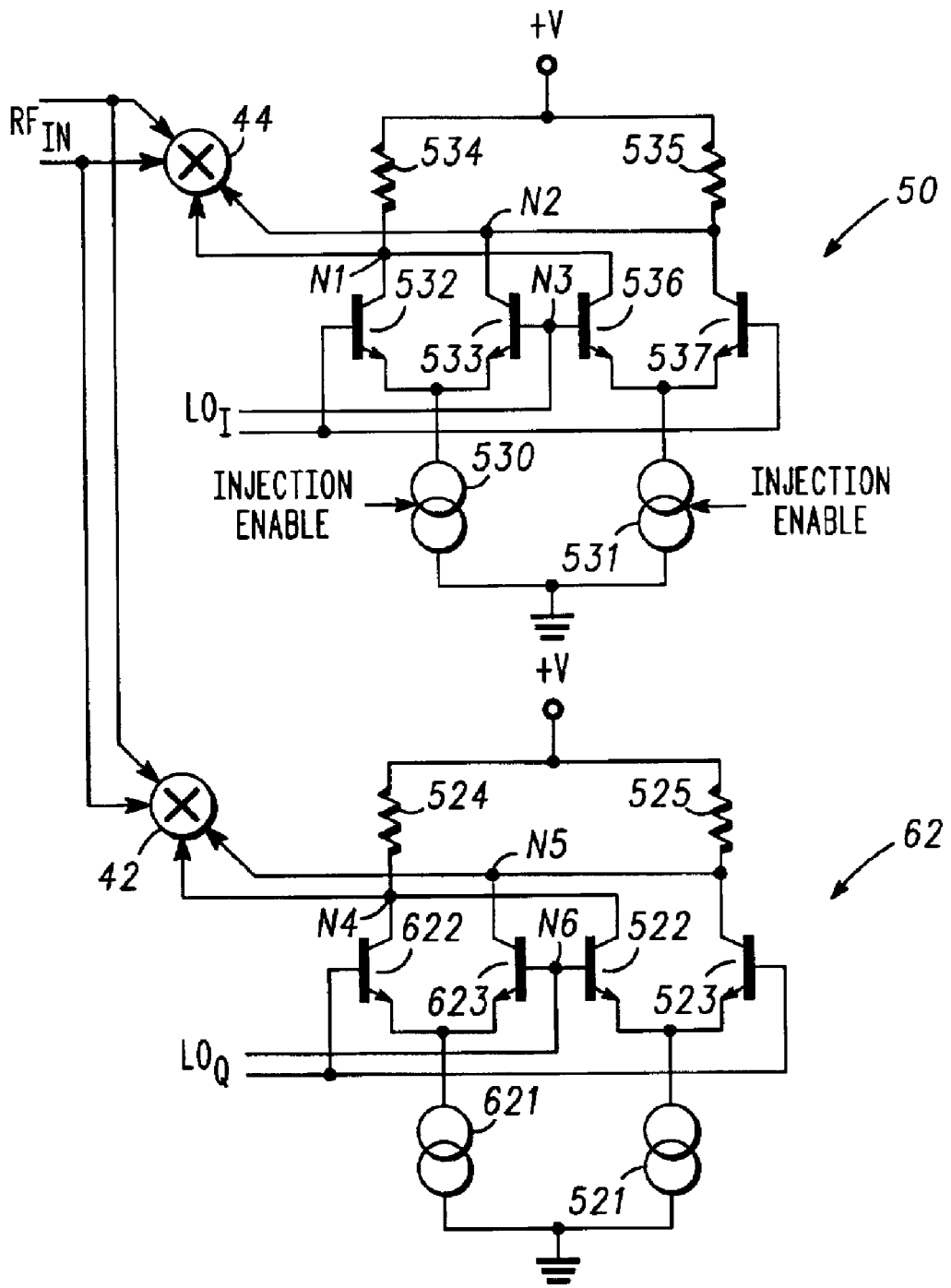
FIG. 8 is schematic circuit diagram of a second quadrature limiter circuit of an image rejection mixer that selectively performs high side and low side injection in accordance with the present invention.

Referring now to FIG. 8, a second embodiment of a Q limiter circuit 62 is shown. The I limiter circuit 50 is the same as the I limiter circuit 50 shown in FIG. 7. In this embodiment, the Q limiter circuit 60 includes a dummy phase inverter so that the Q limiter circuit 60 will have the same phase delay as the I limiter circuit 50.

The Q limiter circuit 60 includes, in addition to the first current source 521, first transistor 522, second transistor 523, and first and second resistors 524, 525, a fourth current source 621, a seventh transistor 622, and an eighth transistor 623. The fourth current source 621 has a first terminal connected to ground and a second terminal connected to the emitters of the seventh and eighth transistors 622, 623, which are connected together. The bases of the seventh and eighth transistors 622, 623 receive the $LO_Q$ signal, which is preferably a differential signal. The collector of the seventh transistor 622 is connected to the first resistor 524 and to the collector of the first transistor 522 at a fourth node N4 and the collector of the eighth transistor 623 is connected to the second resistor 525 and to the collector of the second transistor 523 at a fifth node N5. The bases of the first and eighth transistors 522, 623 are connected together at a sixth node N6. The bases of the second and seventh transistors 523, 622 are connected together too.

In the presently preferred embodiment, the first current source 521 is always enabled and the fourth current source 621 is always disabled.

As is apparent from the above, the present invention provides an image rejection mixer circuit that is switchable for either high-side injection or low-side injection using an enable signal. The image rejection mixer is suitable for low-cost wireless communications and networking between PCs, mobile phones and other devices, such as in the 2.4 GHz ISM band. It will be appreciated by those skilled in the art that changes could be made to the embodiments described above without departing from the broad inventive concept thereof. For example, although the present invention has been described with reference to 2.4 GHz applications, the invention can be adapted and applied to other frequency ranges and communications protocols operating in other frequency ranges. It is understood, therefore, that this invention is not limited to the particular embodiments disclosed, but it is intended to cover modifications within the spirit and scope of the present invention as defined by the appended claims.

What is claimed is:

1. An image rejection mixer, comprising:
   a first mixer that receives an RF input signal and a first local oscillator (LO) signal and generates a first intermediate frequency (IF) output signal, wherein the first LO signal is sin $\omega_{lo}t$;
   a second mixer that receives the RF input signal and a second LO signal and generates a second IF output signal, wherein the second LO signal is $-\cos \omega_{lo}t$, and wherein $\omega_{lo}t$ is a frequency signal generated by a local oscillator;
   a summer connected to the first and second mixers for receiving the first and second IF output signals and generating a combined IF output signal; and
   a phase shift circuit connected between the first mixer and the summer, the phase shift circuit receiving the first IF output signal and generating a phase lag signal, wherein the phase lag signal is provided to the summer and combined with the second IF output signal.

2. The image rejection mixer of claim 1, wherein the phase shift circuit causes the phase lag signal to lag the first IF output signal by about 90 degrees.

3. The image rejection mixer of claim 1, wherein the first and second mixers are differential circuits.

4. The image rejection mixer of claim 1, further comprising:
   a Q limiter circuit connected to the first mixer, the Q limiter circuit receiving an $LO_Q$ signal from the local oscillator and generating the first LO signal therefrom; and an I limiter circuit connected to the second mixer, the I limiter circuit receiving an $LO_I$ signal from the local oscillator and generating the second LO signal therefrom.

5. The image rejection mixer of claim 4, wherein the I limiter circuit receives an injection enable signal for selecting between a high side LO injection and a low side LO injection.

6. The image rejection mixer of claim 5, wherein the Q limiter circuit comprises:
   a first current source having a first terminal connected to ground and a second terminal;
   a first transistor and a second transistor, the emitters of the first and second transistors being connected together and to the second terminal of the first current source, and the bases of the first and second transistors receiving the $LO_Q$ signal;
   a second current source having a first terminal connected to ground and a second terminal;
   a third transistor and a fourth transistor, the emitters of the third and fourth transistors being connected together and to the second terminal of the second current source, and the bases of the third and fourth transistors receiving the $LO_Q$ signal, wherein the collectors of the first and third transistors are connected together at a first node, the collectors of the second and fourth transistors are connected together at a second node, and the bases of the second and third transistors are connected together at a third node;
   a first resistor having a first terminal connected to the first node and a second terminal; and
   a second resistor having a first terminal connected to the second node and a second terminal connected to the second terminal of the first resistor, wherein the first LO signal is a differential signal obtained at the first and second nodes.

7. The image rejection mixer of claim 5, wherein the I limiter circuit comprises:
   a first current source having a first terminal connected to ground and a second terminal;
   a first transistor and a second transistor, the emitters of the first and second transistors being connected together and to the second terminal of the first current source, and the bases of the first and second transistors receiving the $LO_I$ signal;
   a second current source having a first terminal connected to ground and a second terminal;
   a third transistor and a fourth transistor, the emitters of the third and fourth transistors being connected together and to the second terminal of the second current source, and the bases of the third and fourth transistors receiving the $LO_Q$ signal, wherein the collectors of the first and third transistors are connected together at a first node, the collectors of the second and fourth transistors are connected together at a second node, and the bases of the second and third transistors are connected together at a third node;
   a first resistor having a first terminal connected to the first node and a second terminal; and
   a second resistor having a first terminal connected to the second node and a second terminal connected to the second terminal of the first resistor, wherein the second LO signal is a differential signal obtained at the first and second nodes.

8. The image rejection mixer of claim 7, wherein the first current source is enabled by the injection enable signal for high side LO injection and the second current source is enabled by the injection enable signal for low side LO injection.

9. An image rejection mixer with a switchable high or low side local oscillator (LO) injection, the image rejection mixer comprising:
   a Q mixer that receives an RF input signal and a first local oscillator (LO) signal and generates a first intermediate frequency (IF) output signal;
   a Q limiter circuit connected to the Q mixer, the Q limiter circuit receiving an $LO_Q$ signal from the local oscillator and generating the first LO signal therefrom, wherein the $LO_Q$ signal is $\sin \omega_{lo}t$;
   an I mixer that receives the RF input signal and a second LO signal and generates a second IF output signal;
   an I limiter circuit connected to the I mixer, the I limiter circuit receiving an $LO_I$ signal from the local oscillator and generating the second LO signal therefrom, wherein the $LO_I$ signal is $-\cos \omega_{lo}t$, $\omega_{lo}t$ is a frequency signal generated by a local oscillator, and wherein the I limiter circuit receives an injection enable signal for switching between the high side LO injection and the low side LO injection;
   a phase shift circuit connected to the Q mixer and receiving the first IF output signal and generating a phase lag signal that lags the first IF output signal by about 90 degrees; and
   a summer connected to the phase shift circuit and the I mixer for receiving the phase lag signal and the second IF output signal and generating a combined IF output signal.

10. The image rejection mixer of claim 9, wherein the Q limiter circuit comprises:
    a first current source having a first terminal connected to ground and a second terminal;
    a first transistor and a second transistor, the emitters of the first and second transistors being connected together and to the second terminal of the first current source, and the bases of the first and second transistors receiving the $LO_Q$ signal;
    a second current source having a first terminal connected to ground and a second terminal;
    a third transistor and a fourth transistor, the emitters of the third and fourth transistors being connected together and to the second terminal of the second current source, and the bases of the third and fourth transistors receiving the $LO_Q$ signal, wherein the collectors of the first and third transistors are connected together at a first node, the collectors of the second and fourth transistors are connected together at a second node, and the bases of the second and third transistors are connected together at a third node;
    a first resistor having a first terminal connected to the first node and a second terminal; and
    a second resistor having a first terminal connected to the second node and a second terminal connected to the second terminal of the first resistor, wherein the first LO signal is a differential signal obtained at the first and second nodes.

11. The image rejection mixer of claim 10, wherein the I limiter circuit comprises:
    a third current source having a first terminal connected to ground and a second terminal;
    a fifth transistor and a sixth transistor, the emitters of the fifth and sixth transistors being connected together and to the second terminal of the third current source, and the bases of the fifth and sixth transistors receiving the $LO_I$ signal;

a fourth current source having a first terminal connected to ground and a second terminal;

a seventh transistor and an eighth transistor, the emitters of the seventh and eighth transistors being connected together and to the second terminal of the fourth current source, and the bases of the seventh and eighth transistors receiving the $LO_I$ signal. wherein the collectors of the fifth and seventh transistors are connected together at a fourth node, the collectors of the sixth and eighth transistors are connected together at a fifth node, and the bases of the sixth and seventh transistors are connected together at a sixth node;

a third resistor having a first terminal connected to the third node and a second terminal; and a fourth resistor having a first terminal connected to the fifth node and a second terminal connected to the second terminal of the third resistor, wherein the second LO signal is a differential signal obtained at the fourth and fifth nodes.

12. The image rejection mixer of claim 11, wherein the third current source is enabled by the injection enable signal for high side LO injection and the fourth current source is enabled by the injection enable signal for low side LO injection.

13. A quadrature limiter circuit comprising:

an I limiter circuit including an I limiter first side and an I limiter second side, wherein the I limiter first side is a phase inverting side and the I limiter second side is a phase non-inverting side, the I limiter circuit receiving a first local oscillator (LO) signal and generating a pair of I limiter output signals, wherein an injection enable signal is provided to the I limiter first and second sides for selectively enabling one of the I limiter first and second sides; and a Q limiter circuit including a Q limiter first side and a Q limiter second side, the Q limiter circuit receiving a second local oscillator (LO) signal and generating a pair of Q limiter output signals, wherein the Q limiter comprises:

a first current source having a first terminal connected to ground and a second terminal;

a first transistor and a second transistor, the emitters of the first and second transistors being connected together and to the second terminal of the first current source, and the bases of the first and second transistors receiving the second LO signal;

a second current source having a first terminal connected to ground and a second terminal;

a third transistor and a fourth transistor, the emitters of the third and fourth transistors being connected together and to the second terminal of the second current source, and the bases of the third and fourth transistors receiving the first LO signal, wherein the collectors of the first and third transistors are connected together at a first node, the collectors of the second and fourth transistors are connected together at a second node, and the bases of the second and third transistors are connected together at a third node;

a first resistor having a first terminal connected to the first node and a second terminal; and a second resistor having a first terminal connected to the second node and a second terminal connected to the second terminal of the first resistor, wherein the pair of Q limiter output signals are obtained at the first and second nodes.

14. The quadrature limiter circuit of claim 13, further comprising:

an I mixer circuit connected to the I limiter circuit, the I mixer circuit receiving an RF input signal and the pair of I limiter output signals, and generating a first intermediate frequency (IF) signal therefrom; and a Q mixer circuit connected to the Q limiter circuit, the Q mixer circuit receiving the RF input signal and the pair of Q limiter output signals, and generating a second IF signal therefrom.

15. The quadrature limiter circuit of claim 13, wherein the first LO signal received by the I limiter circuit comprises $-\cos \omega_{lo}t$, the second LO signal received by the Q limiter circuit comprises $\sin \omega_{lo}t$, and wherein $\omega_{lo}t$ is a frequency signal generated by a local oscillator.

16. A method of generating an intermediate frequency (IF) signal from a radio frequency (RF) signal, the method comprising the steps of:

mixing an RF input signal and a first local oscillator (LO) signal to generate a first intermediate frequency (IF) output signal, wherein the first LO signal is $\sin \omega_{lo}t$;

mixing the RF input signal and a second LO signal to generate a second IF output signal, wherein the second LO signal is $-\cos \omega_{lo}t$, and wherein $\omega_{lo}t$ is a frequency signal generated by a local oscillator;

phase shifting the first IF output signal to generate a phase lag signal; and summing the phase lag signal and the second IF output signal to generate a combined IF output signal.

17. The method of generating an IF signal of claim 16, further comprising the step of:

performing one of high side injection and low side injection on the first LO signal in accordance with a value of an injection enable signal prior to mixing the first LO signal with the RF signal to generate the first IF output signal.

* * * * *